United States Patent [19]

Kobayashi et al.

[11] Patent Number: 4,901,203
[45] Date of Patent: Feb. 13, 1990

[54] HYBRID INTEGRATED CIRCUIT MODULE ASSEMBLY

[75] Inventors: Tetsuo Kobayashi; Teruhisa Ohkawa, both of Itami, Japan

[73] Assignee: Mitsubishi Denki Kabushiki Kaisha, Japan

[21] Appl. No.: 279,797

[22] Filed: Dec. 5, 1988

[30] Foreign Application Priority Data

Mar. 15, 1988 [JP] Japan .................................. 63-59362

[51] Int. Cl.$^4$ ................................................ H05K 7/20
[52] U.S. Cl. .................................... 361/395; 361/386; 361/424
[58] Field of Search .............. 361/386, 387, 388, 395, 361/424, 396, 399, 412, 413; 165/80.3; 211/41; 174/35 R; 439/76, 95, 485

[56] References Cited

U.S. PATENT DOCUMENTS

| | | | |
|---|---|---|---|
| 4,218,724 | 8/1980 | Kaufman | 361/395 |
| 4,716,498 | 12/1987 | Ellis | 361/395 |
| 4,723,196 | 2/1988 | Hofmeister | 361/395 |
| 4,771,365 | 9/1988 | Cichocki | 361/387 |
| 4,811,165 | 3/1989 | Currier | 361/395 |
| 4,823,235 | 4/1989 | Suzuki | 361/395 |

FOREIGN PATENT DOCUMENTS 59-225545  12/1984  Japan.
61-240643  10/1986  Japan.

Primary Examiner—Gerald P. Tolin
Attorney, Agent, or Firm—Leydig, Voit & Mayer

[57] ABSTRACT

A hybrid integrated circuit module asssembly includes a conductive casing having at least a pair of inner surfaces facing each other, first and second insulating substrates mounted on the inner surfaces and facing each other, and first and second circuits which may be a power amplifier circuit and a driving circuit for driving the power amplifier circuit, the first and the second circuits being formed on the facing surfaces of the first and second insulating substrates, respectively.

3 Claims, 3 Drawing Sheets

HYBRID INTEGRATED CIRCUIT MODULE ASSEMBLY

BACKGROUND OF THE INVENTION

1. Field of the Invention

The present invention relates to a hybrid integrated circuit and, more particularly, to a hybrid integrated circuit for operation at a high frequency and a high output level.

2. Description of the Related Art

FIG. 4 shows the construction of a typical hybrid integrated circuit for operation at a high frequency and a high output level. The circuit has an insulating substrate 1 on which are formed a plurality of conductor patterns 2 to 8. A semiconductor chip 9 is bonded to the conductor pattern 2 by, for example, soldering. The semiconductor chip 9 has a grounding line formed on the surface thereof where it is bonded to the conductor pattern 2 and internal electrodes formed on the other surface thereof. The grounding line is connected to the conductor pattern 2 as a result of bonding of the semiconductor chip 9 to the conductor pattern 2. The internal electrodes on the other surface of the semiconductor chip 9 are respectively connected to the conductor patterns 3 and 4 through thin metal wires 10. Circuit elements such as chip capacitors 11, 12 are connected between the conductor patterns. Leads 13 are connected at one of their ends to the conductor patterns 6 to 8 while the other ends of the leads 13 are led externally from the insulating substrate 1. A grounding thin conductor film 14 such as of Ag/Pt or Au is formed over the entire area of the reverse side of the insulating substrate 1. The thin conductor film 14 is electrically connected to the conductor pattern 2 via a through hole connection 15.

The insulating substrate 1 is mounted on a grounding and heat-radiating metallic plate 16 by bonding the thin conductor film 14 to the metallic plate 16. In addition, mounted on the metallic plate 16 is a cap 17 which is made of plastic and which covers the insulating substrate 1, protecting the insulating substrate 1.

A high-frequency current is input to the hybrid integrated circuit through the leads 13 to operate the hybrid integrated circuit. As a result, the semiconductor chip 9 generates heat which is transmitted via the conductor pattern 2, the through hole connection 15 and the thin conductor film 14 to the metallic plate 16 so as to be radiated therefrom. Thus, in the conventional hybrid integrated circuit, a single insulated substrate 1 is mounted on the metallic plate 16 and a single circuit is formed on the insulating substrate 1.

In general, an electronic device comprises a plurality of circuits. It is often convenient and, hence, desirable to pack two or more of these circuits in a single package to reduce the size of the whole electronic device. For instance, a power amplifier circuit and a driver circuit for driving the power amplifier circuit are preferably integrated in a single hybrid integrated circuit rather than being arranged separately and connected together. The result is a reduction in the size of the apparatus and an improvement in its reliability.

Previously, for the purpose of forming a hybrid integrated circuit of a higher density, it was necessary that a plurality of circuits be mounted on a comparatively large metallic plate. This goes quite contrary to the demand for reduction in the size of the electronic device. Another problem encountered with the described conventional arrangement arises from the use of a dielectric material such as plastic as the material for the cap 17 which covers and protects the insulated substrate 1. Namely, such a dielectric material tends to allow mutual electromagnetic interference between the hybrid integrated circuit and external circuits, particularly when the hybrid integrated circuit is designed for operation at a high frequency and a high output level. This reduces the reliability of the electronic device. For these reasons, it has been necessary to shield the electronic device by a conductive material.

SUMMARY OF THE INVENTION

Accordingly, it is an object of the present invention to provide a hybrid integrated circuit having an increased scale of integration and capable of operating with a high degree of reliability without any electromagnetic interference from external circuits.

To this end, according to the present invention, there is provided a hybrid integrated circuit which comprises a conductive casing having at least a pair of inner surfaces opposing each other, first and second insulating substrates mounted on the opposing inner surfaces of the casing, and first and second circuits formed on the opposing surfaces of the first and the second insulating substrates.

According to the invention, the casing, being made of a conductive material and having a pair of insulating substrates disposed therein, not only serves as a grounding and heat-radiating conductors for the pair of insulating substrates but also as an electromagnetic shield which effectively shields the first and the second circuits.

DESCRIPTION OF THE PREFERRED EMBODIMENTS

Preferred embodiments of the present invention will be described hereinunder with reference to the drawings.

Figure 1:
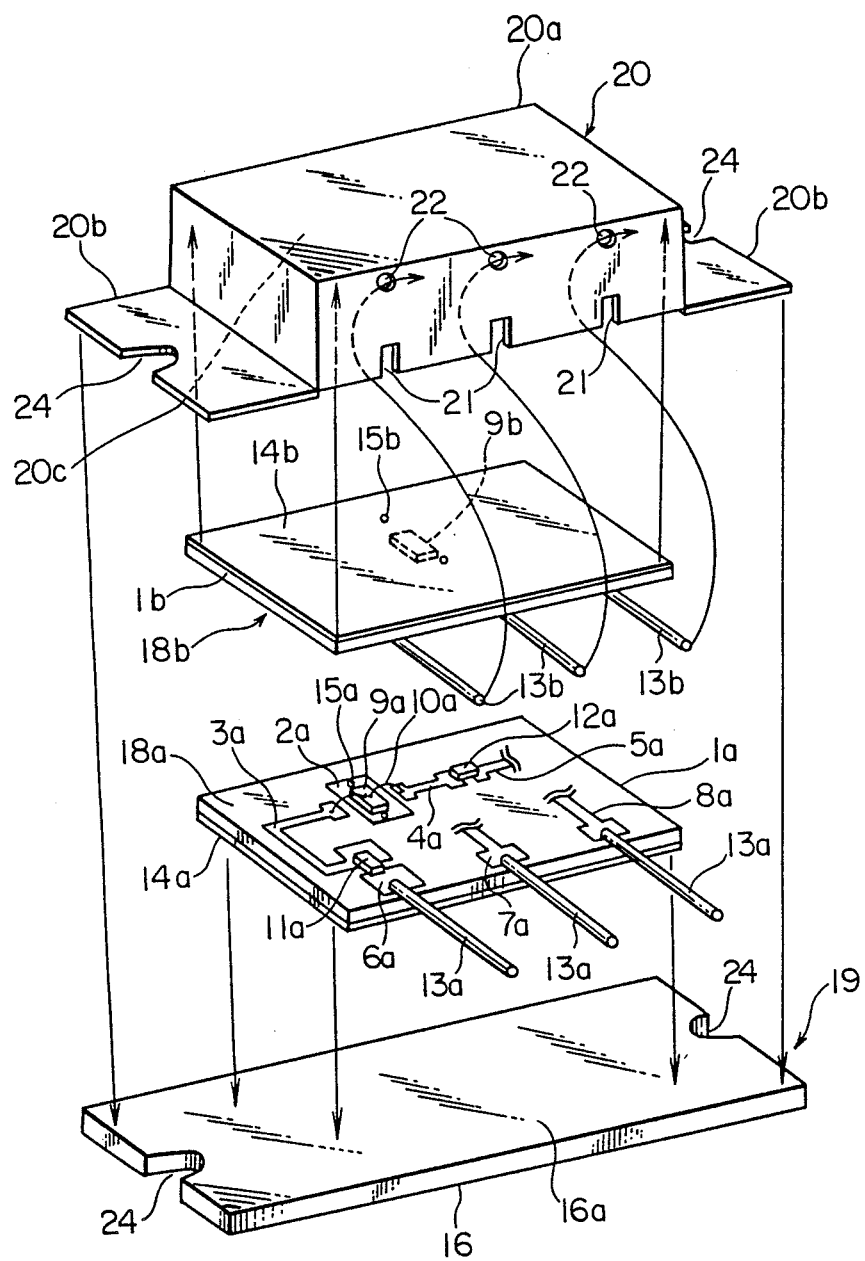
FIG. 1 is an exploded perspective view of a hybrid integrated circuit according to one embodiment of the present invention.

FIG. 1 is an exploded perspective view of a hybrid integrated circuit as an embodiment of the present invention, designed for operation at high frequencies and output levels.

Figure 4:
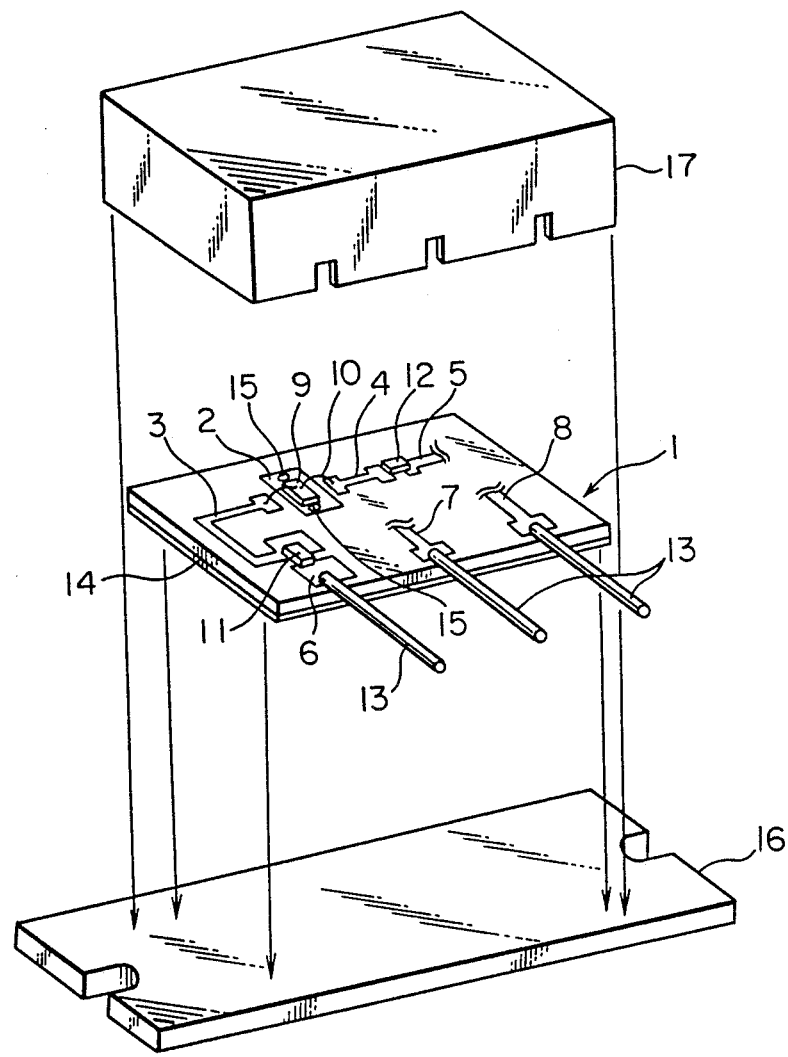
FIG. 4 is an exploded perspective view of a conventional hybrid integrated circuit.

Referring to FIG. 1, first and second insulating substrates 1a and 1b have the same construction as the insulating substrate 1 in the conventional device explained before in connection with FIG. 4.

Namely, conductor patterns 2a to 8a are formed on an insulating substrate 1a made of, for example, a ceramic material, and a semiconductor chip 9a is bonded by, for example, soldering to the conductor pattern 2a. The semiconductor chip 9a has a grounding line which is formed on the side thereof at which it is bonded to the conductor pattern 2a and internal electrodes which are formed on the other side thereof. The grounding line is connected to the conductor pattern 2a as a result of the bonding of the semiconductor chip 9a to the conductive pattern 2a. On the other hand, the internal electrodes of the semiconductor chip 9a are respectively connected to the conductor patterns 3a and 4a by thin metal wires 10a. Circuit elements such as chip capacitors 11a and 12a are connected between the conductor patterns. Leads 13a are connected at one of their ends to the conductor patterns 6a to 8a while the other ends of these leads are led externally from the insulating substrate 1a. In consequence, a first circuit 18a is formed on the insulating substrate 1a by the conductive patterns 2a to 8a, the semiconductor chip 9a, the thin metal wires 10a, the chip capacitors 11a and 12a, and leads 13a.

A grounding thin conductor film 14a such as of Ag/Pt or Au is formed on the entire area of the reverse side of the insulating substrate 1a. The conductor pattern 2a and the thin conductor film 14a are electrically connected to each other via a through hole 15a.

Similarly, a second circuit 18b is formed on the obverse side of the second insulating substrate 1b, while a thin conductor film 14b is formed on the reverse side of the second insulating substrate 1b. The first insulating substrate 1a and the second insulating substrate 1b are mounted in a casing 19. The casing 19 comprises a conductor plate 16 and a conductor cap 20 which is mounted on the conductor plate 16. The conductor cap 20 has a casing portion 20a which is opened at its side facing the conductor plate 16 and a flange portion 20b which extends externally from the opened end of the casing portion 20a. The flange portion 20b is welded to the conductor plate 16, whereby the conductor plate 16 and the conductor cap 20 are electrically connected to each other.

The thin conductor film 14a of the first insulating substrate 1a is bonded to the surface 16a of the conductor plate 16 of the casing 19, while the conductor film 14b of the second insulating substrate 1b is bonded to the ceiling surface 20c of the casing portion 20a of the conductor cap 20. The second insulating substrate 1b is arranged in an inverted relation to the first insulating substrate 1a. Namely, the first circuit 18a and the second circuit 18b face each other. Thus, in FIG. 1, the second circuit 18b is disposed behind the insulating substrate 1b (lower side as viewed in FIG. 1). For the purpose of clarification, only the semiconductor chip 9b and leads 13b of the second circuit 18b are shown in dotted lines.

The leads 13a and 13b of the first and second circuits 18a and 18b are respectively led to the outside of the conductor cap 20 through the notches 21 and the through holes 22 which are provided in a lateral side of the casing portion 20a of the conductor cap 20.

Figure 2:
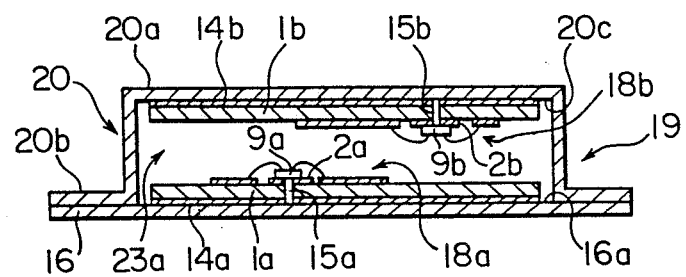
FIG. 2 is a sectional view of the embodiment shown in FIG. 1.

More specifically, as shown in FIG. 2, a closed space 23a is formed between the conductor plate 16 and the conductor cap 20, and the first and the second insulating substrates 1a and 1b are disposed on the opposing inner surfaces of the space 23 such that the circuits 18a and 18b on these substrates face each other. The thin conductor films 14a and 14b on the respective insulating substrates 1a and 1b are bonded to the conductor plate 16 and the conductive cap 20, whereby the grounding lines of the circuits 18a and 18b are connected to the conductor casing 19.

This hybrid integrated circuit can be produced by a process which will be explained hereinunder.

Referring again to FIG. 1, the first circuit 18a and the second circuit 18b are respectively formed on the surfaces of the first insulating substrate 1a and the second insulating substrate 1b, whereas the thin conductor films 14a and 14b are formed on the reverse sides of the first insulating substrate 1a and the second insulating substrate 1b, respectively. Then, the thin conductor film 14a of the first insulating substrate 1a is bonded to the surface 16a of the conductor plate 16, while the thin conductor film 14b of the second insulating substrate 1b is bonded to the ceiling surface 20c of the conductor cap 20. At this time, the leads 13b of the second circuit 18b are led externally through the conductor cap 20 via the through holes 22 formed in the side walls of the casing portion 20a of the conductor cap 20.

Subsequently, the conductor cap 20 is mounted on the conductor plate 16 so as to guide the leads 13a of the first circuit 18a externally through the conductor cap 20 via the notches 21 therein, and the flange portion 20b of the conductor cap 20 is bonded to the conductor plate 16.

The hybrid integrated circuit thus formed is mounted on a housing (not shown) or the like part of an electric device through notches 24 formed in the ends of the conductor plate 16 and the flange portion 20b of the conductor cap 20, and is fastened thereto by means of, for example, bolts.

When a high-frequency electric current is supplied to the hybrid integrated circuit through the leads 13a and 13b so as to activate the circuits 18a and 18b, the semiconductor chips 9a and 9b generate heat. The heat generated by the semiconductor chip 9a of the first circuit is transmitted to the housing of the electric device through the conductor pattern 2a, through hole connection 15a, thin conductor film 14a and the conductor plate 16. The heat generated by the semiconductor chip 9b of the second circuit 18b is transmitted through the conductor pattern 2b, through hole connection 15b, thin conductor film 14b and the conductor cap 20 to the housing of the electric device, and is externally radiated from the housing.

Figure 3:
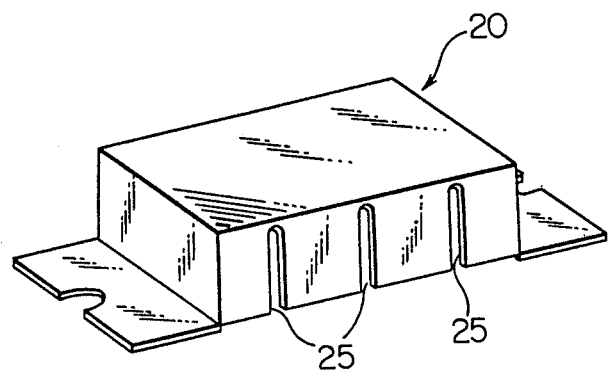
FIG. 3 is a perspective view of a metallic cap incorporated in another embodiment of the present invention.

A strong electromagnetic field is easily formed around the first and the second circuits 18a and 18b as a result of the supply of the high-frequency current to the circuits 18a and 18b. These circuits 18a and 18b are shielded by means of the conductor casing 19, so that any undesirable effect on circuits around the casing 19 is avoided. Similarly, an influence of any external electromagnetic fields on the first and the second circuits 18a and 18b within the hybrid integrated circuit is minimized so that the hybrid integrated circuit can operate with improved reliability. Although in the described embodiment the notches 21 and the through holes 22 for externally leading the leads 13a and 13b are provided for the first circuit 18a and the second circuit 18b, respectively, the arrangement may be such that a single elongated notch 25 is formed so as to be used commonly for the lead 13a of the first circuit 18a and the lead 13b of second circuit 18b, as will be seen from FIG. 3.

The arrangement also may be such that portions of the first circuit 18a and the second circuit 18b are connected by, for example, wires within the conductor casing 19, so that the leads can be led from either one of the first and the second circuits 18a and 18b. In such a case, the number of the notches 21 and the through holes 22 may be reduced, whereby the through holes 22 or the notches 21 may not be required.

The first circuit 18a and the second circuit 18b may be a power amplifier circuit and a driver circuit for driving the power amplifier circuit. In such a case, it is preferable to have the power amplifier circuit, which produces a greater amount of heat than does the driver circuit, mounted on the conductor plate 16, since such an arrangement enables the heat to be efficiently transmitted to the housing of the electric device thereby providing a higher heat radiation efficiency.

In addition, the first and second circuits 18a and 18b may be of a power system and of a control system, respectively, or may both be power amplifier circuits which have different frequency ranges from each other such as a VHF range and a UHF range. Other sorts of circuits can be arranged in a hybrid integrated circuit according to the present invention as the first and second circuits 18a and 18b.

It is also possible to have a further conductor plate, which is electrically connected to the conductor casing 19, provided between the first insulating substrate 1a and the second insulating substrate 1b, and to have an insulating substrate different from the first and the second substrates mounted on this conductor plate, whereby a multi-layered structure having three or more layers with three or more circuits incorporated therein can be obtained.

The conductor casing 19 may be made from a metal or various other conductive materials. In order to attain a higher heat radiation performance, however, the conductor casing is made from a material which has a high heat conductivity. It is also to be understood that the insulating substrates 1a and 1b may be formed from various insulating materials though a ceramics material is used in the described embodiment.

As will be understood from the foregoing description, according to the present invention, it is possible to obtain a hybrid integrated circuit in which electromagnetic interference between the circuit and other external circuits is suppressed to ensure a higher reliability of operation, while attaining an increased scale of integration.

What is claimed is:

1. A hybrid integrated circuit module assembly comprising:
   an electrically conductive plate having opposed first and second surfaces;
   an electrically conductive cap including inner and outer surfaces, an opening, and a pair of flanges extending from said cap adjacent the opening wherein said cap is mechanically and electrically joined at said flanges to said first surface of said plate;
   first and second insulating substrates disposed inside said cap on said inner surface and said first surface, respectively; and
   first and second circuits disposed facing each other on said first and second insulating substrates, respectively.

2. The hybrid integrated circuit module assembly according to claim 1 wherein said electrically conductive cap has notches and through holes through which leads of said first circuit and leads of said second circuit respectively extend.

3. The hybrid integrated circuit module assembly according to claim 1, wherein said electrically conducting cap includes at least one notch through which leads of said first and second circuits commonly extend.

* * * * *